United States Patent
Hamase

(10) Patent No.: US 7,023,258 B2
(45) Date of Patent: Apr. 4, 2006

(54) SWITCH CIRCUIT

(75) Inventor: Seiji Hamase, Shiga (JP)

(73) Assignee: NEC Corporation, Tokyo (JP)

( * ) Notice: Subject to any disclaimer, the term of this patent is extended or adjusted under 35 U.S.C. 154(b) by 1043 days.

(21) Appl. No.: 09/983,591

(22) Filed: Oct. 25, 2001

(65) Prior Publication Data

US 2002/0051444 A1    May 2, 2002

(30) Foreign Application Priority Data

Oct. 26, 2000    (JP) .............................. 2000-326674

(51) Int. Cl.
*H04L 5/00* (2006.01)
*H04L 12/50* (2006.01)
*H01P 1/10* (2006.01)
*H01P 1/22* (2006.01)

(52) U.S. Cl. ...................... 327/308; 370/359; 333/101; 333/81 R

(58) Field of Classification Search ................ 327/308; 333/81 R, 101; 370/359; 307/141.8, 140, 307/130, 129, 139
See application file for complete search history.

(56) References Cited

U.S. PATENT DOCUMENTS 5,969,560 A * 10/1999 Kohama et al. ............ 327/308
6,118,985 A     9/2000 Kawakyu et al. ............. 455/78
6,542,045 B1 * 4/2003 Nishibe .................... 333/81 R

FOREIGN PATENT DOCUMENTS

JP        11-46101        2/1999

* cited by examiner

*Primary Examiner*—Ricky Ngo
*Assistant Examiner*—Feben Micael Haile
(74) *Attorney, Agent, or Firm*—Foley & Lardner LLP

(57) ABSTRACT

A plurality of first transistors are connected in series between the first terminal and the second terminal. A plurality of second transistors are connected in series between the first terminal and the third terminal. One end of a resistor is connected to the first terminal, and the other end of the resistor is grounded. Either the first transistor or the second transistor is controlled to be ON. A resistance value of the resistor is set at such a value that a difference between a gate voltage of the first or second transistor being ON and a pinch-off voltage of the first or second transistor being ON is set greater than the amplitude of the potential of the first terminal which varies upon reception of a signal flowing to the first terminal. In this structure, the first and second transistors are appropriately operated regardless of signal frequency.

4 Claims, 4 Drawing Sheets

SWITCH CIRCUIT

BACKGROUND OF THE INVENTION

1. Field of the Invention

The present invention relates to a switch circuit.

2. Description of the Related Art

Each transceiver employed in mobile communications includes a switch circuit for switching an input path from and to an output path of high-frequency signals.

The switch circuit includes FETs (Field Effect Transistors) in the input and output paths, to open or close the paths, respectively. The switch circuit activates either FETs arranged in the input path or FETs arranged in the output path, and inactivates the other one FET, thereby to switch the path from one to another through which high-frequency signals flow.

In the case where a large amplitude signal is input to the above switch circuit, the FETs may undesirably be operated so as to deteriorate the waveform of their output signals.

In a switch circuit disclosed in Unexamined Japanese Patent Application KOKAI Publication No. H11-46101, to prevent the deterioration in the waveform of output signals when a large amplitude signal is input to the switch circuit, an inductor and a capacitor are connected in parallel with each other between the source and drain of each FET.

However, the frequency of input signals, which can be effected by the structure including the inductor and capacitor being connected with each other, is limited by a resonance circuit including an inductor and a capacitor. In other words, if a signal has the frequency which is not in a frequency range to be limited by the resonance circuit, the waveform of output signal may be deteriorated. Hence, a problem is that the technique disclosed in Unexamined Japanese Patent Application KOKAI Publication No. H11-46101 can not be adapted for those switch circuits handling signals in a wide range of frequencies.

The entire contents of Unexamined Japanese Patent Application KOKAI Publication No. H11-46101 are incorporated herein by reference.

SUMMARY OF THE INVENTION

The present invention has been made in consideration of the above. It is accordingly an object of the present invention to provide a switch circuit which operates stably regardless of the signal frequency.

In order to achieve the above object, according to the first aspect of the present invention, there is provided a switch circuit comprising;

a first transistor which is connected between a first terminal and a second terminal;

a second transistor which is connected between the first terminal and a third terminal; and a resistor one end of which is connected to the first terminal and other end of which is grounded, and wherein either the first transistor or the second transistor is controlled to be ON, and the resistor has a resistance value which is set at such a value that a difference between a gate voltage of the first transistor or second transistor being ON and a pinch-off voltage of the first transistor or second transistor being ON is set greater than an amplitude of a potential of the first terminal which varies by a signal flowing to the first terminal.

According to this invention, there can he provided a switch circuit is stably operated regardless of the frequency of the signal flowing to the first terminal.

In the switch circuit;

the first transistor may include a plurality of transistors which are connected with each other in series between the first terminal and the second terminal; and the second transistor include a plurality of transistors which are connected with each other in series between the first terminal and the third terminal.

In the switch circuit, each of the first transistor and the second transistor may be a junction-type Field Effect Transistor which is formed of gallium arsenic.

In the switch circuit:

the resistor may be a variable resistor; and the switch circuit may further include a measurement circuit which measures the amplitude of the potential of the first terminal, and a control circuit which sets a resistance value of the resistor in accordance with the amplitude measured by the measurement circuit.

BRIEF DESCRIPTION OF THE DRAWINGS

The object and other objects and advantages of the present invention will become more apparent upon reading of the following detailed description and the accompanying drawings in which.

DETAILED DESCRIPTION OF THE PREFERRED EMBODIMENT

An IC switch according to an embodiment of the present invention will now be depicted with reference to the accompanying drawings.

Figure 1:
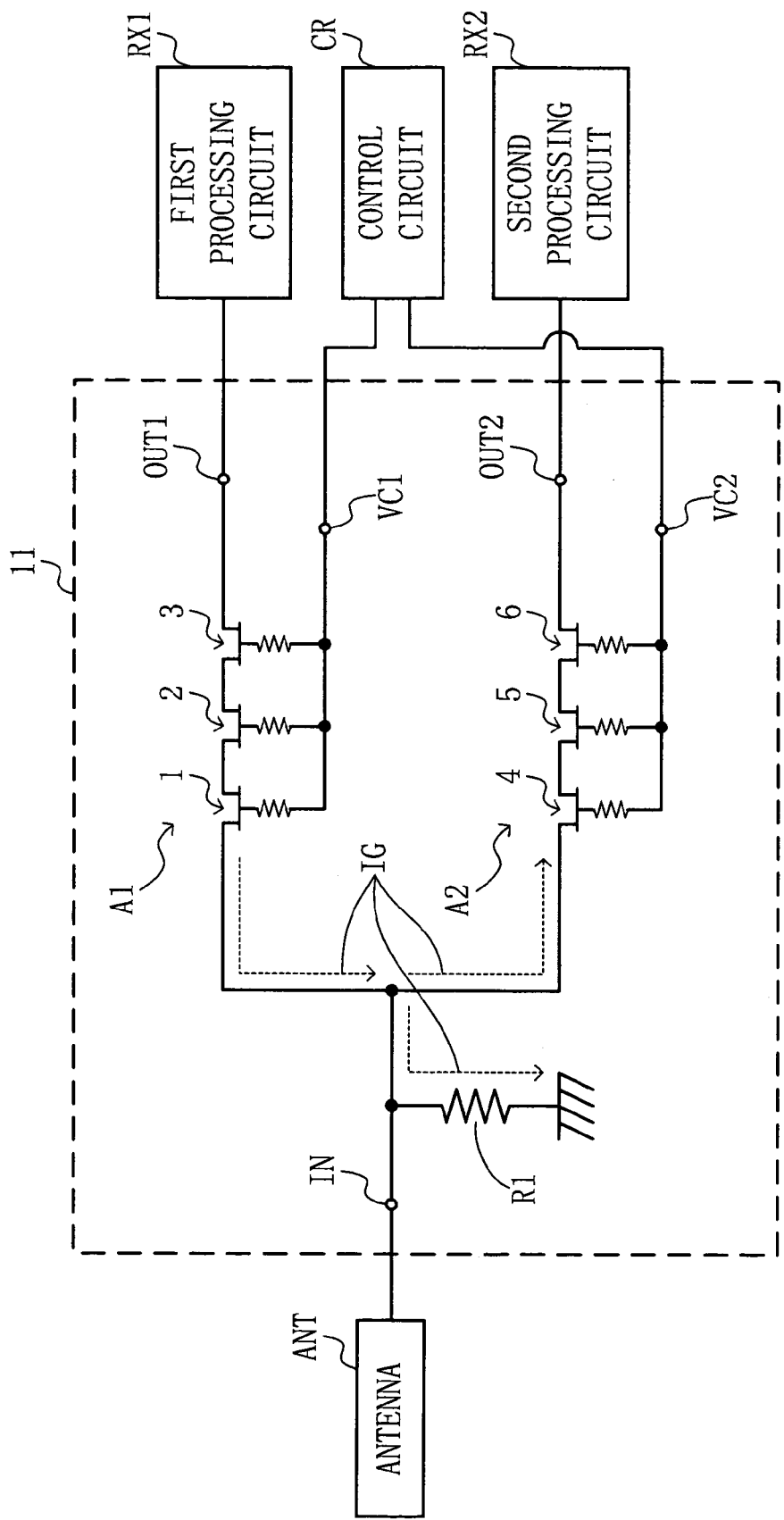
FIG. 1 is a diagram showing an equivalent circuit of an IC switch according to an embodiment of the present invention.

FIG. 1 shows an equivalent circuit of an IC switch 11 according to this embodiment.

The IC switch 11 includes a resistor R1 and a plurality of FETs (Field Effect Transistors). In FIG. 1, the IC switch 11 includes six FETs 1 to 6, for example. Each of the FETs 1 to 6 is an n-channel junction-type FET which is formed of gallium arsenic.

The IC switch 11 has an input terminal IN, the first output terminal OUT1, the second output terminal OUT2, the first control terminal VC1 and the second control terminal VC2.

The FETs 1, 2 and 3 are connected in series along the first path A1 between the input terminal IN and the first output terminal OUT1. The gate of each of the FETs 1, 2 and 3 is connected to the first control terminal VC1. The FETs 1, 2 and 3 operate in accordance with a control voltage supplied from a control circuit CR connected to the first control terminal VC1.

The FETs 4, 5 and 6 are connected in series along the second path A2 between the input terminal IN and the second output terminal OUT2. The gate of each of the FETs 4, 5 and 6 is connected to the second control terminal VC2. The FETs 4, 5 and 6 operate in accordance with a control voltage supplied from a control circuit CR connected to the second control terminal VC2.

The control voltage to be applied to the gate of each of the FETs 1, 2 and 3 and the control voltage to be applied to the FETs 4, 5 and 6 are complementary to each other. Specifically, in the case where the control voltage to be applied to each of the FETs 1, 2 and 3 is at a high level, the control voltage to be applied to each of the FETs 4, 5 and 6 is at a low level. On the hand, in the case where the control voltage to be applied to each of the FETs 1, 2 and 3 is at a low level, the control voltage to be applied to each of the FETs 4, 5 and 6 is at a high level. In this structure, then, either one of the first path A1 and the second path A2 is in a conductive state.

An antenna ANT is connected to the input terminal IN, and the first processing circuit RX1 is connected to the first output terminal OUT1, and the second processing circuit RX2 is connected to the second output terminal OUT2.

RF (Radio Frequency) signals are transmitted between the antenna ANT and the first processing circuit RX1 or between the antenna ANT and the second processing circuit RX2, respectively through the first path A1 or the second path A2.

The first processing circuit RX1 executes a predetermined signal process for RF signals (high-frequency signals) supplied from the antenna ANT. Otherwise, the first processing circuit RX1 sends RF signals for which a predetermined signal process is done, to the antenna ANT.

The second processing circuit RX2 executes a predetermined signal process for RF signals supplied from the antenna ANT. Otherwise, the second processing circuit RX2 sends RF signals for which a predetermined signal process is done, to the antenna ANT.

One end of the resistor R1 is connected to the input terminal IN, and the other end thereof is grounded. The resistance value of the resistor R1 is set at such a value that a difference between the gate voltage VG of the FET and the pinch-off voltage thereof is larger than the amplitude of the RF signals, as will more specifically be explained later. In this structure, those FETs 1, 2 and 3 or FETs 4, 5 and 6 which are ON will not be OFF upon reception of an RF signal.

Functions and operations of the IC switch 11 according to the embodiment of the present invention will now be described.

Explanations will now be made to the IC switch 11, particularly in the case where the FETs 1, 2 and 3 are ON and the FETs 4, 5 and 6 are OFF. Now, let it be assumed that the potential ($VC_{High}$) of the first control terminal VC1 is +2.7V, the potential ($VC_{Low}$) of the second control terminal VC2 is 0V, the forward voltage VF of each of the FETs 1, 2 and 3 is +0.3V, and the pinch-off voltage VP of each of the FETs 1 to 6 is −0.5V.

In the case where the resistance value of the resistor R1 is infinite, the potential of the input terminal IN is +2.4V which is obtained by subtracting the forward voltage VF (=+0.3V) from the potential ($VC_{High}$=+2.7V) of the first control terminal VC1. In other words, the gate voltage VG of each of the FETs 1, 2 and 3 is +0.3V which is obtained by subtracting the potential (+2.4V) or the input terminal IN from the potential ($VC_{High}$=+2.7V) of the first control terminal VC1. In this manner, the gate voltage (=+0.3V) of each of the FETs 1, 2 and 3 is greater than the pinch-off voltage VP (=−0.5V), resulting in that the FETs 1, 2 and 3 are ON.

In the case where the resistance value of the resistor R1 is infinite, the gate voltage VG of each of the FETs 4, 5 and 6 is −2.4V which is obtained by subtracting the potential (+2.4V) of the input terminal IN from the potential ($VC_{Low}$=0V) of the second control terminal VC2. In this manner, the gate voltage (=−2.4V) of each of the FETs 4, 5 and 6 is smaller than the pinch-off voltage VP (−0.5V), resulting in that the FETs 4, 5 and 6 are OFF.

Figure 2:
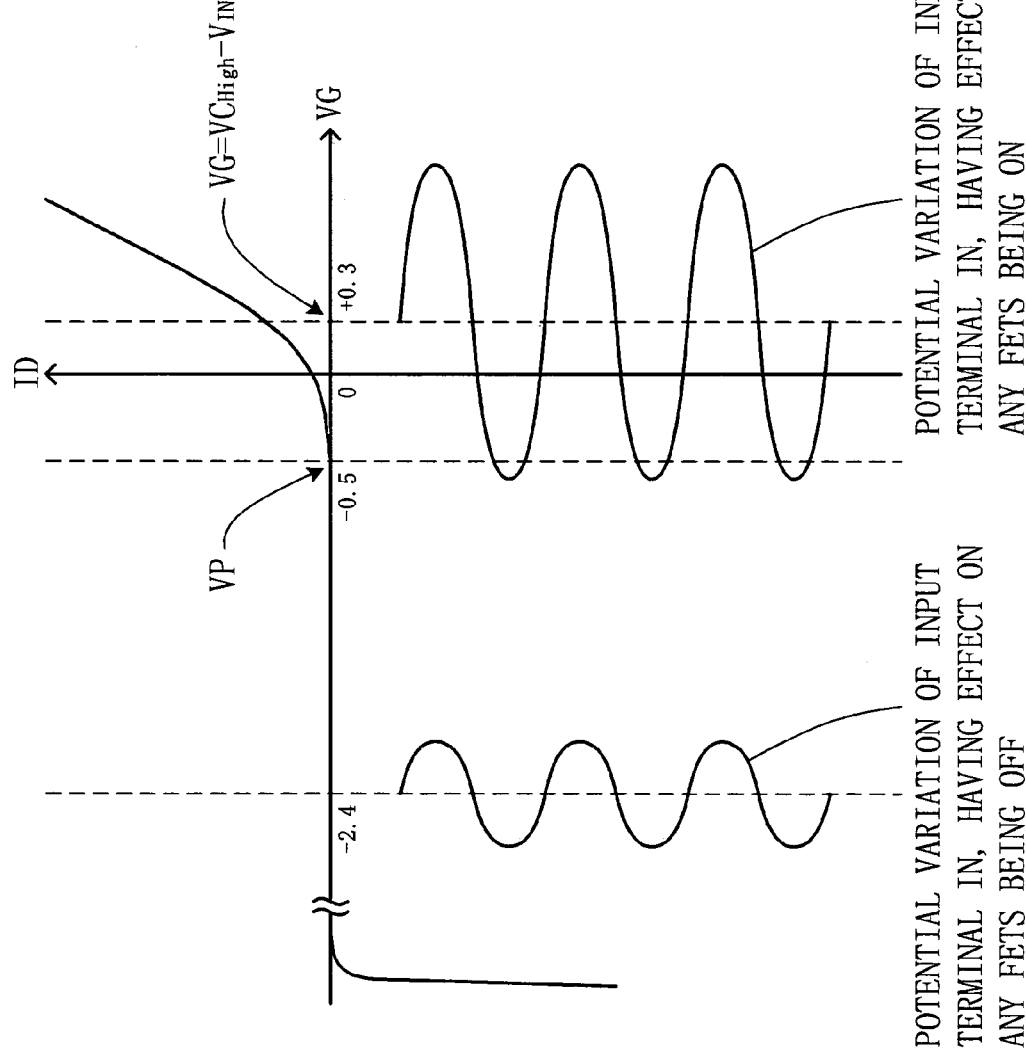
FIG. 2 is a diagram showing the relationship between the ID-VG characteristics of an FET included in the IC switch of FIG. 1 and the potential variation of an input terminal upon reception of an RF signal, in the case where the resistance value or a resistor included in the IC switch of FIG. 1 is infinite.

In the above circumstances, if an RF signal flows to the input terminal IN, the potential of the input terminal IN varies by an amount corresponding to the amplitude of the RF signal as shown in FIG. 2. Upon this, the gate voltage VG of each of the FETs 1, 2 and 3 varies by an amount corresponding to the amplitude of the RF signal. For example, in the case where the amplitude of the RF signal is +1.0V, the potential of the input terminal IN varies in a range from +1.4V to +3.4V, and the gate voltage VG of each of the FETs 1, 2 and 3 varies in a range from −0.7V to −1.3V. In this case, as illustrated in FIG. 2A, the gate voltage VG of each of the FETs 1, 2 and 3 may be lower than their pinch-off voltage VP. Hence, any of those FETs 1, 2 and 3 which is ON may periodically be OFF.

Because the FETs 4, 5 and 6 are connected with each other in series, the effect of the potential variation is divided into three, so that one third of the effect is delivered to each of the FETs 4, 5 and 6. In other words, the variation of the gate voltage VG of each of the FETs 4, 5 and 6 is one third the variation of the gate voltage VG of each of the FETs 1, 2 and 3. Thus, any of those FETs 4, 5 and 6 which is OFF will not be ON upon reception of the RF signal.

If the resistance value of the resistor R1 is set at such a value that a difference between the gate voltage VG of each of the FETs 1, 2 and 3 and its pinch-off voltage VP is greater than the amplitude of the RF signal, i.e. the amplitude of potential of the input terminal IN which varies upon reception of the RF signal, the above-described potential variation of the input terminal IN can be prevented from having an effect on the FETs 4, 5 and 6, Gate current IG flows in a direction from high-potential points to low-potential points. Specifically, in this case, the gate current IG flows from the FETs 1, 2 and 3 to the FETs 4, 5 and 6 and the resistor R1 (in the directions denoted by broken arrows shown in FIG. 1).

The gate current IG flowing to the FETs 4, 5 and 6 is very little, because the FETs 4, 5 and 6 are OFF.

The amount of gate current IG flowing to the resistor R1 may vary depending on the resistance value of the resistor R1. Hence, if the resistance value of the resistor R1 is adjusted, the potential of the input terminal IN can be adjusted. Specifically, the lower the resistance value becomes, the gate current IG, flowing to the resistor R1 gets greater and the potential of the input terminal IN gets lower.

Figure 3:
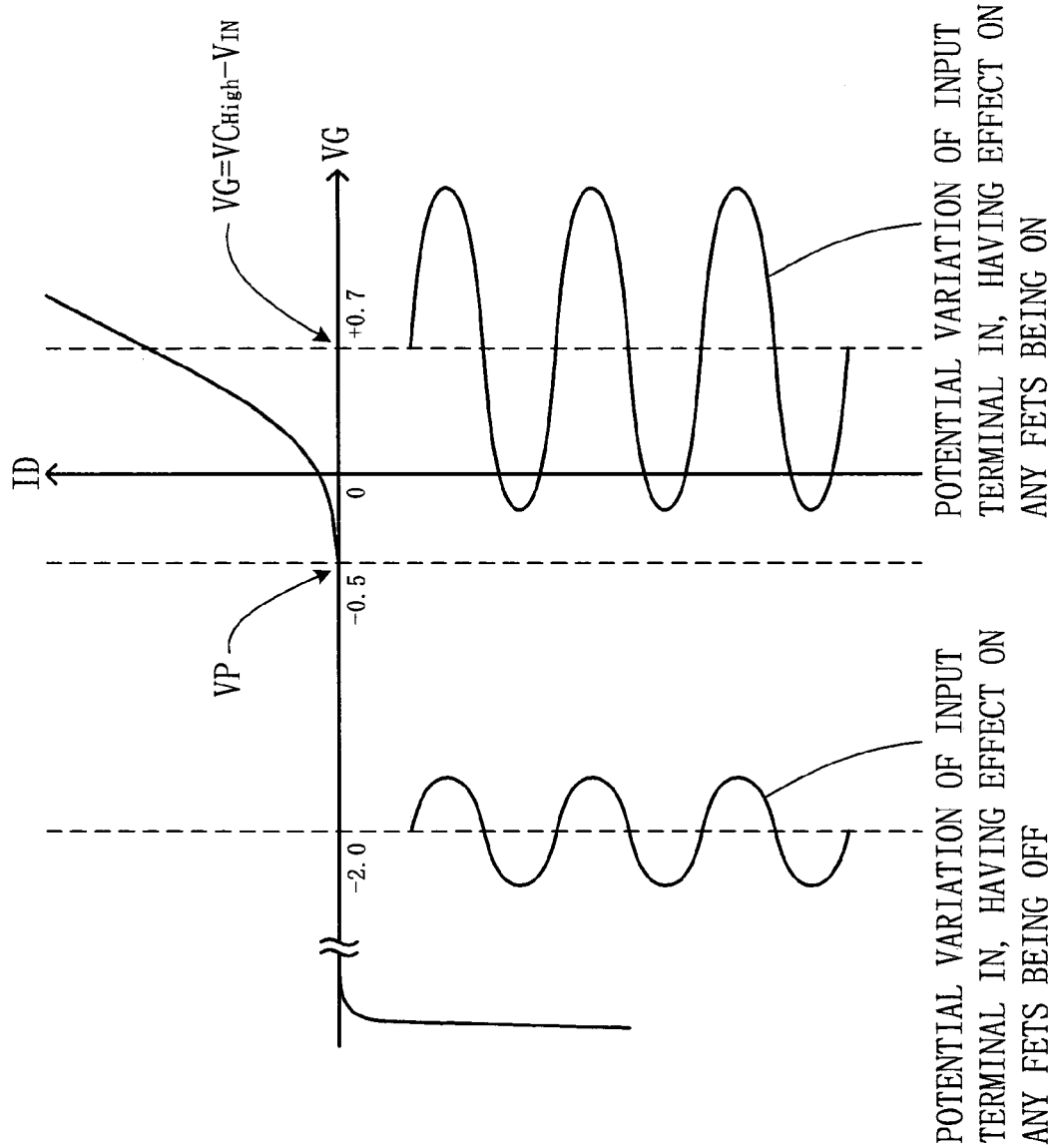
FIG. 3 is a diagram showing the relationship between the ID-VG characteristics of the FET included in the IC switch of FIG. 1 and the potential variation of the input terminal upon reception of an RF signal, in the case where the resistance value of the resistor included in the IC switch of FIG. 1 is several ten kΩ.

In the case where the resistance value of the resistor R1 is set at several ten kΩ, e.g. within a range from 30 to 70 kΩ, the potential of the input terminal IN will approximately be +2.0V. In the case where the potential of the input terminal IN is set at +2.0V, the gate voltage VG of each of the FETs 1, 2 and 3 is +0.7V. Hence, the difference between the gate voltage VG and pinch-off voltage VP is +1.2V. This difference is greater than the amplitude (+1.0V) of the RF signal, as shown in FIG. 3. Thus, the FETs 1, 2 and 3 will not be OFF by the effect of the potential variation of the input terminal IN.

In the case where the resistance value of the resistor R1 is several ten kΩ, the gate voltage VG of each of the FETs 4, 5 and 6 is −2.0V which can be obtained by subtracting the potential (+2.0V) of the input terminal IN from the potential ($VC_{Low}$=0V) of the second control terminal VC2. Since the gate voltage VG (=2.0V) is smaller than the pinch-off voltage (−0.5V), each of the FETs 4, 5 and 6 will be OFF.

In this case as well, as shown in FIG. 3, the effect of the potential variation of the input terminal IN is divided into three, so that only one third of the effect is delivered to each of the FETs 4, 5 and 6. The variation of the gate voltage VG of each of the FETs 4, 5 and 6 is one third of the variation of the gate voltage VG of each of the FETs 1, 2 and 3. Thus, each of the FETs 4, 5 and 6 which is being OFF will not be ON upon reception of the RF signal.

If the resistance value of the resistor R1 is set at a value which is sufficiently larger than the resistance value (several Ω) of each of the activated FETs 1, 2 and 3, i.e. at several ten kΩ, only a very small amount of RF signal can flow to the resistor R1, and hence resulting in only negligible loss of RF signal.

The functions and operations of the IC switch 11 in the case where the FETs 1, 2 and 3 are OFF and the FETs 4, 5 and 6 are ON are substantially the same as the above, except that the FETs 1, 2 and 3 are switched to the FETs 4, 5 and 6.

Figure 4:
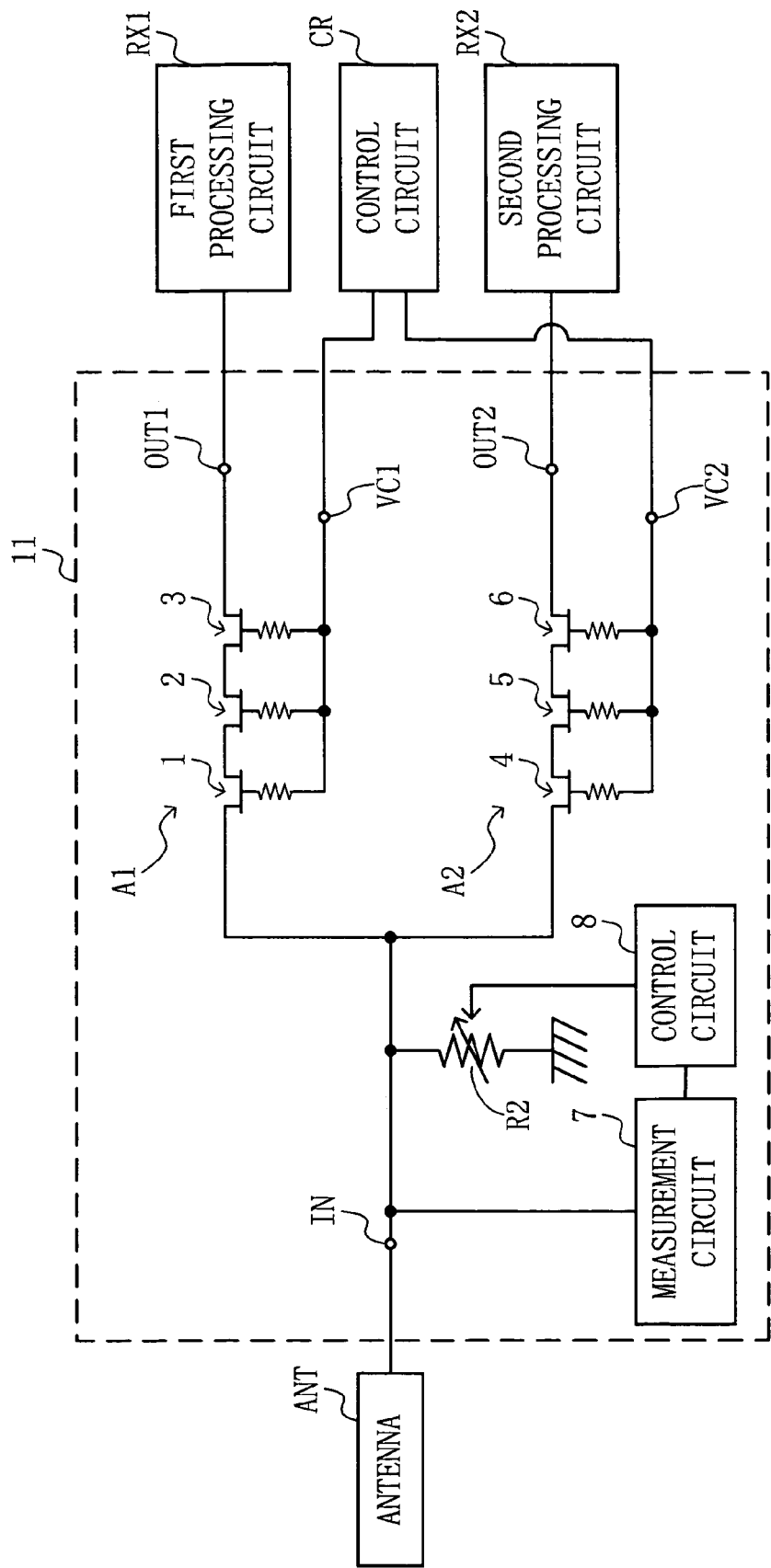
FIG. 4 is a diagram showing another structure of the IC switch according to the embodiment of the present invention.

As explained above, the input terminal IN is grounded through the resistor R1, and the resistance value of the resistor R1 is adjusted, thereby stably operating the IC switch 11. Since the operations of the IC switch 11 is stably operated by the resistor R1, the switch circuit 11 can stably process signals in a wide range of frequency band As illustrated in FIG. 4, the IC switch 11 may include a variable resistor R2 in place of the resistor R1, and may further has a measurement circuit 7 and a control circuit 8. The measurement circuit 7 measures the variation width of the potential of the input terminal IN or the amplitude of the RF signals flowing to the input terminal IN. The control circuit 8 includes a decoder, etc., and sets the resistance value of the variable resistor R2 in accordance with the variation width of the potential or amplitude measured by the measurement circuit 7. In this structure, the resistance value of the variable resistor R2 can be changed in accordance with the variable width of the potential of the input terminal IN or the amplitude of the RF signals, and hence realizing the IC switch 11 which can stable be operated even upon reception of R1 signals with various amplitudes.

Each of the FETs 1 to 6 may be a p-channel FET instead of an n-channel FET. It is preferred that each of the FETs 1 to 6 be formed of gallium arsenic so as to operate in a high frequency band at a high rate.

The number of the FETs is not limited to six. The more the number of the FETs being connected with each other in series becomes, the less the potential variation of the input terminal IN has an effect on the FETs being OFF. Thus, the more the number of FETs being connected with each other in series, the more the IC switch 11 becomes stably operable.

Various embodiments and changes may be made thereonto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2000-326674 filed on Oct. 26, 2000, and including specification, claims, drawings and summary. The disclosure of the above Japanese Patent Application is incorporated herein by reference in its entirety.

What is claimed is:

1. A switch circuit comprising:
    a first transistor which is connected between a first terminal and a second terminal;
    a second transistor which is connected between said first terminal and a third terminal; and
    a resistor one end of which is connected to said first terminal and other end of which is grounded, and
    wherein either said first transistor or said second transistor is controlled to be ON, and
    said resistor has a resistance value which is set at such a value that a difference between a gate voltage of said first transistor or second transistor being ON and a pinch-off voltage of the first transistor or second transistor being ON is set greater than an amplitude of a potential of said first terminal which varies by a signal flowing to said first terminal.

2. The switch circuit according to claim 1, wherein:
    said first transistor includes a plurality of transistors which is connected with each other in series between said first terminal and said second terminal; and
    said second transistor includes a plurality of transistors which is connected with each other in series between said first terminal and said third terminal.

3. The switch circuit according to claim 2, wherein each of said first transistor and said second transistor is a junction-type Field Effect Transistor which is formed of gallium arsenic.

4. The switch circuit according to claim 1, wherein:
    said resistor is a variable resistor; and
    said switch circuit further includes
        a measurement circuit which measures the amplitude of the potential of said first terminal, and
        a control circuit which sets a resistance value of said resistor in accordance with the amplitude measured by said measurement circuit.

* * * * *